US006390753B1

(12) United States Patent
De Ridder

(10) Patent No.: US 6,390,753 B1
(45) Date of Patent: May 21, 2002

(54) SYSTEM FOR LOADING, PROCESSING AND UNLOADING SUBSTRATES ARRANGED ON A CARRIER

(75) Inventor: Christianus Gerardus Maria De Ridder, Hoogland (NL)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 09/380,391

(22) PCT Filed: Feb. 23, 1998

(86) PCT No.: PCT/NL98/00105

§ 371 Date: Nov. 3, 1999

§ 102(e) Date: Nov. 3, 1999

(87) PCT Pub. No.: WO98/38672

PCT Pub. Date: Sep. 3, 1998

(30) Foreign Application Priority Data

Feb. 28, 1997 (NL) ............................................. 1005410

(51) Int. Cl.$^7$ ............................................. H01L 21/00
(52) U.S. Cl. ........................ 414/160; 414/172; 414/940; 414/937; 432/239; 118/719
(58) Field of Search ......................... 118/719; 432/239, 432/241; 414/217, 217.1, 416.03, 416.08, 940, 403, 172, 935, 937, 160; 204/298.25; 29/428, 240

(56) References Cited

U.S. PATENT DOCUMENTS

| 4,770,590 A | | 9/1988 | Hugues et al. | |
| 4,938,691 A | * | 7/1990 | Ohkase et al. | 414/172 X |
| 5,273,423 A | * | 12/1993 | Shiraiwa | 414/940 X |
| 5,407,449 A | | 4/1995 | Zinger | |
| 5,421,892 A | | 6/1995 | Miyagi | |
| 5,443,648 A | * | 8/1995 | Ohkase | |
| 5,556,275 A | * | 9/1996 | Sakata et al. | |
| 5,829,939 A | * | 11/1998 | Iwai et al. | 414/940 X |

FOREIGN PATENT DOCUMENTS

EP 0238751 * 9/1987

* cited by examiner

Primary Examiner—Frank E. Werner
(74) Attorney, Agent, or Firm—Knobbe, Martens, Olson & Bear, LLP

(57) ABSTRACT

In a system for loading, processing and unloading substrates, a carrier has a bottom and a plurality of slots to receive a plurality of substrates for processing in a reactor. The reactor is tubular and has an inlet opening to receive the carrier loaded with substrates. A handling robot loads and unloads the substrates to and from the carrier when the carrier is located outside the reactor. A rotatable base plate supports the carrier and moves the carrier between a first position in proximity of the handling robot and a second position in proximity of the reactor. A lifting device introduces and removes the carrier in and from the reactor by lifting and lowering the carrier from and to the base plate when the carrier is in the second position. A door plate is coupled to the lifting device and to the bottom of the carrier. The door plate closes the inlet opening of the reactor when the carrier is introduced in the reactor and seals the reactor during processing. A coupling mechanism acts upon the bottom of the carrier and through the door plate to thereby rotate the carrier when the carrier is introduced in the reactor so that the substrates are uniformly processed. A drive motor is stationarily arranged and activates the coupling mechanism to rotate the carrier when the carrier is introduced in the reactor.

5 Claims, 4 Drawing Sheets

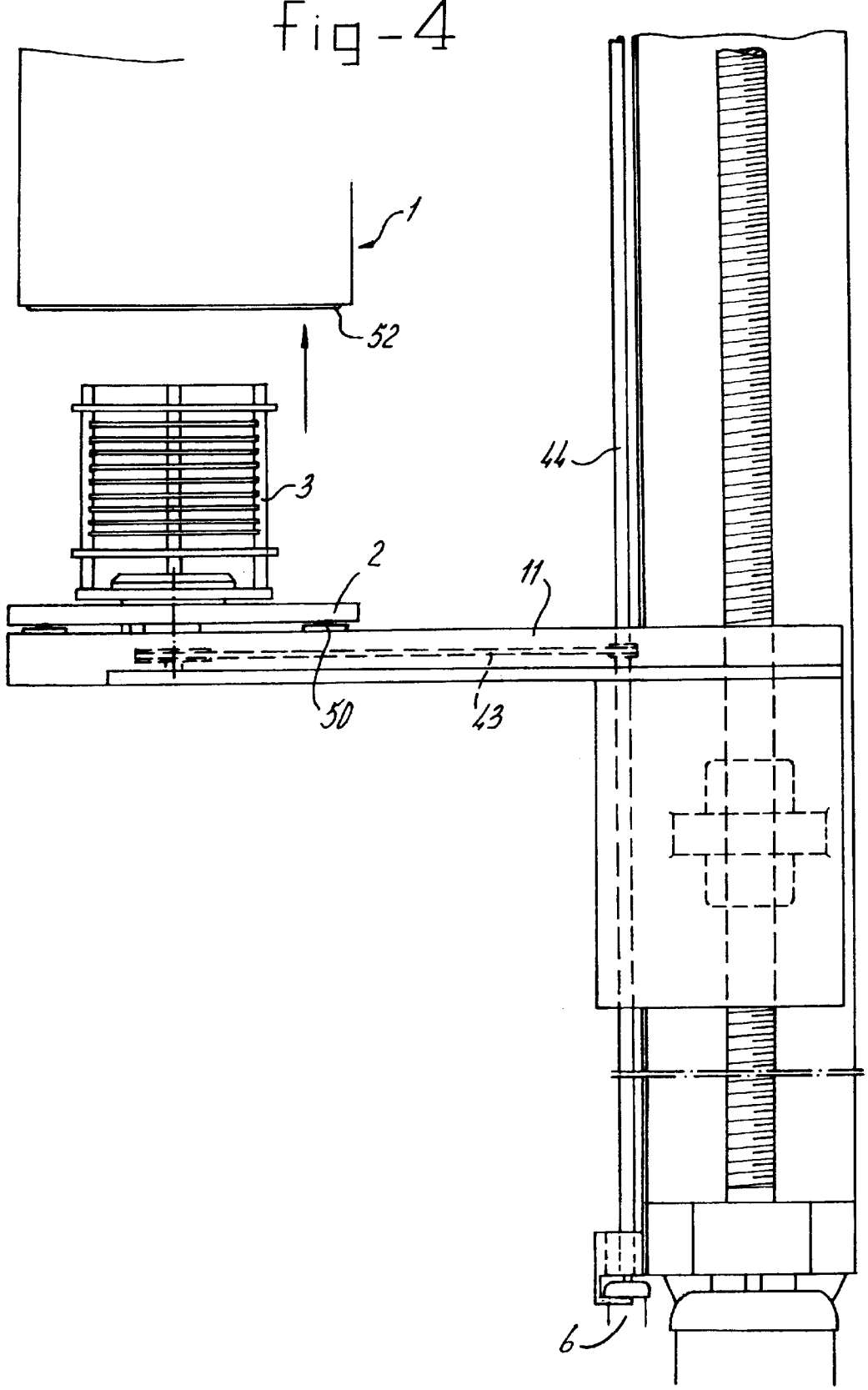

SYSTEM FOR LOADING, PROCESSING AND UNLOADING SUBSTRATES ARRANGED ON A CARRIER

FIELD OF THE INVENTION

The present invention relates to a system for loading, processing and unloading substrates, such as wafers, which are arranged on a carrier in a reactor, such as an oven comprising feed means for the said substrates, a transport surface, such as a turntable, an introduction device for the said reactor as well as removal means for the said substrates.

BACKGROUND OF THE INVENTION

A system of this kind is known from U.S. Pat. No. 5,407,449 in the name of Zinger. In the structure described in that patent, at most three carriers (boats) are arranged on a rotary table. A carrier is situated in front of the gaslock which seals off the chamber in which the reactor is arranged from the environment. Wafers are fed through this gaslock to a carrier placed in front of it. After the carrier has been filled, it is moved on one position to beneath an oven and placed in the oven using a lifting device. Processing then takes place in the oven and after the lifting device has removed the carrier and replaced it on the transport surface, i.e. the turntable, the carrier with wafers is allowed to cool. The carrier is then moved to a following position and is again situated in front of the gaslock, where it can be emptied and refilled.

In this way, the actual processing time in the oven determines the passage in the system, i.e. there is sufficient time while processing a carrier in the over to allow another carrier to be unloaded and reloaded whale a subsequent carrier, with the wafers present therein, is allowed to cool gradually under optimum conditions.

In this way, it is possible to achieve a particularly high capacity for a single oven.

Although a system of this kind is advantageous, for certain applications it is moreover required that the heat distribution through the wafers be as uniform as possible during the processing in the oven while, moreover, an optimum distribution of the process gas becomes critical. In order to satisfy these various requirements, it is proposed to arrange the wafers, together with the carrier, in a rotating manner. With the structure according to the U.S. Pat. No. 5,421,892 this causes a handling problem.

SUMMARY OF THE INVENTION

The object of the present invention is, in the system according to the U.S. Pat. No. 5,407,449, to arrange the carriers rotatably in the oven while the complex fixed connection between carrier and the electric motor, as described in U.S. Pat. No. 5,421,892, is avoided.

This object is achieved in a system as described above in that said carrier is provided with a door plate for the said reactor being connected to said carrier, a fixedly arranged drive motor being present for rotational movement of the said carrier, as well as coupling means for bringing about and interrupting the said rotating connection between drive motor and carrier.

The invention is based on the idea of not connecting the door plate to the lifting device permanently, as in U.S. Pat. No. 5,421,892. In the device according to the invention, the door plate with carrier is provided with semiconductor wafers before it is introduced into the oven, and then the unit filled in this way is introduced into the oven using the known lifting device, coupling taking place in any form using a rotating connection. The unit comprising carrier and door plate is then removed from the oven and allowed to cool, and subsequently the carrier is emptied. However, in the meantime, a door plate/carrier unit which has meanwhile been filled can be placed in the oven. In this way, it is possible to work particularly quickly and efficiently. Owing to the longer residence time of the door plate outside the oven, the door plate will heat up less rapidly and there is less need for drastic measures to be taken in order to ensure that there is a seal between oven and door plate.

The rotary drive of the carrier can basically be realized in two ways. Firstly, the carrier may be arranged in a rotary manner in the door plate, as is known per se from U.S. Pat. No. 5,421,892. The carrier is then driven by coupling to the lifting means which move the door plate with carrier into the oven and in which lifting means there is a rotary drive for the carrier. This rotary drive may even be arranged outside the chamber in which the processing operations take place.

According to another approach, the door plate is arranged rotatably in the oven and after it has been closed against the oven the door plate is set in rotary motion. In this case, of course, the carrier is mounted in a fixed position in the door plate.

BRIEF DESCRIPTION OF THE DRAWINGS

The invention will be explained in more detail below with reference to two exemplary embodiments which are depicted in the drawings, in which:

FIG. 4 shows a side view in accordance with FIG. 2; and

DETAILED DESCRIPTION OF THE INVENTION

Figure 1:
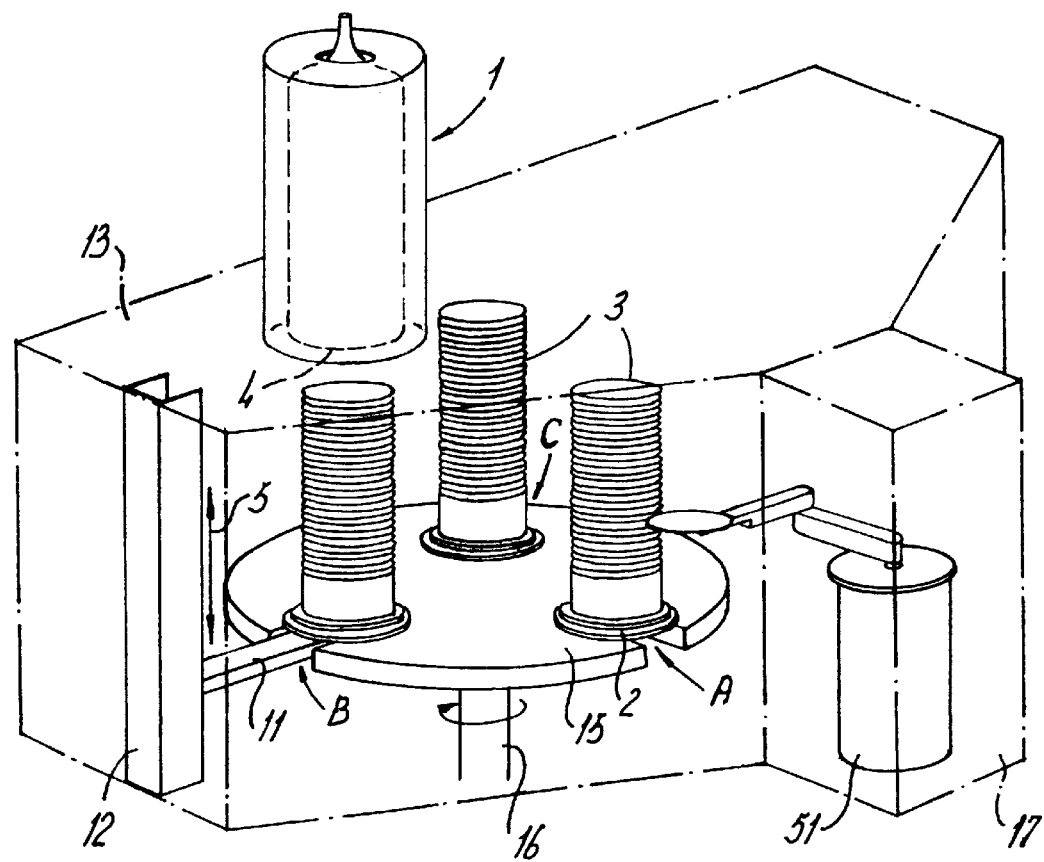
FIG. 1 in general shows the way in which semiconductor substrates are loaded, processed and unloaded according to a first embodiment of the invention.

In FIG. 1, 1 denotes an oven. The opening 4 opens into a housing which is indicated by dot-dashed line 13. A specific atmosphere, for example an inert $N_2$ atmosphere, can be maintained inside this housing. 2 denotes a door plate which can be moved upwards in the direction of arrow 5 with the aid of a lifting device 12, which is provided with an arm 11, so that the door plate 2, with the carrier 3, which is provided with wafers 14, arranged on it, can be moved into the oven. Door plate 2 is positioned on a base plate 15, which can rotate as indicated by arrow 16. 51 denotes a handling robot which is placed in a different chamber, the shielding of which is indicated by dot-dashed lines 17. Chambers 13 and 17 can be connected to one another via an gaslock. Robot 51 forms part of a cluster arrangement. Reference is made in this connection for example to the U.S. Pat. No. 5,407,449.

The various positions of the door plate 2 with carrier 3 are indicated in FIG. 1 by A, B and C. In position A, the carrier 3 is empty and is being filled with wafers 14. Then, base plate 15 is rotated, so that position A–B, etc. After that, the carrier 3 in question, together with door plate 2, is moved upwards until it reaches the underside of the oven 1, whereupon the wafers are processed. This may involve any processing operation known in the prior art. The carrier with wafers and door plate is then removed from the oven, placed on base plate 15 and this base plate 15 is moved on one position. In position C, the wafers can cool while the next carrier, which meanwhile has been filled, is placed in the oven together with the door plate. In a subsequent position, the carrier can be emptied and new wafers can be placed in the carrier.

Figure 2:
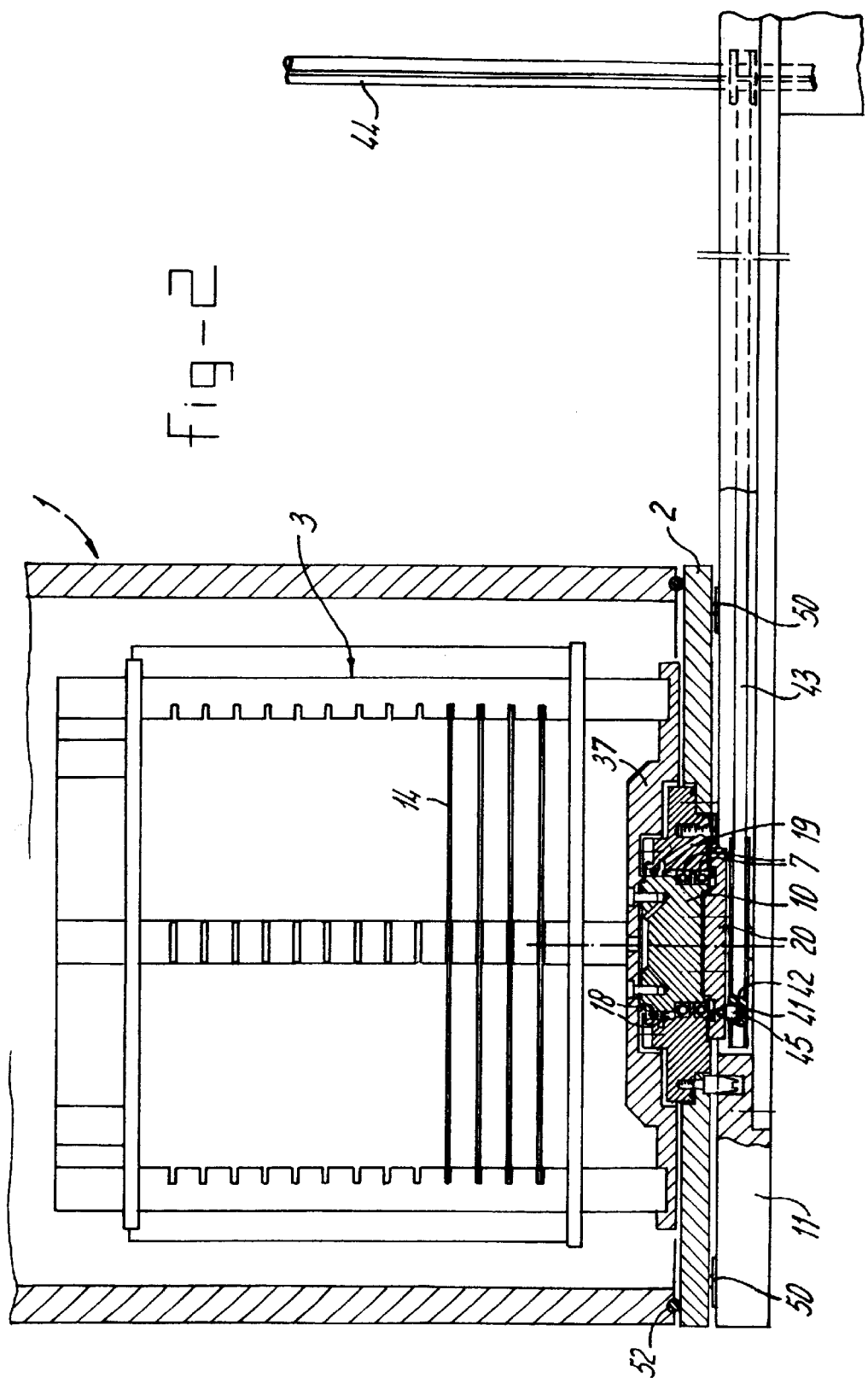
FIG. 2 diagrammatically shows partially in section, a side view of the door plate-carrier unit in accordance with FIG. 1.

FIG. 2 shows details of the door plate/carrier unit. From this figure it can be seen that the door plate 2 is provided with two bearings 7 which are at a distance apart and between which there extends a shaft 10 which is connected to the bottom plate 37 of carrier 3. 18 denotes seals, and a channel 19 is present between the seals 18, which channel is evacuated in order to discharge any gases leaking past the upper seal 18. It is also possible to blow gases into channel 19. On the underside, shaft 10 is provided with a flange 20 which is provided with a coupling pin 41.

Figure 3:
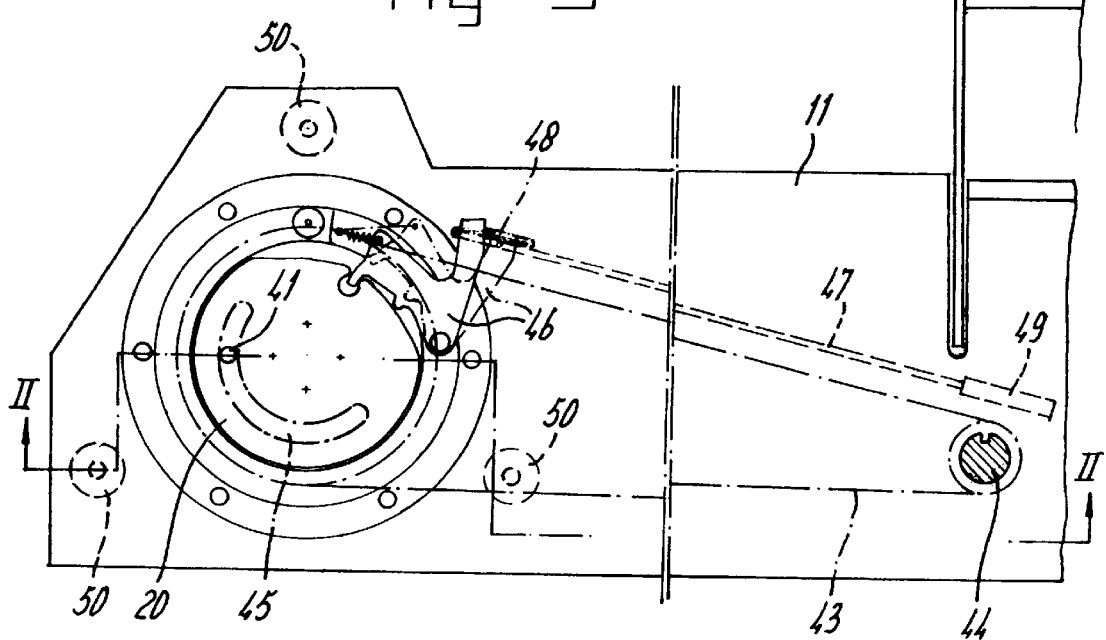
FIG. 3 shows a top view of the arm in accordance with FIG. 2.

Rotation of flange 20 with respect to door plate 2 can be blocked with the aid of locking arm 46 (FIG. 3). The latter is shown both in the blocked position (continuous lines) and in the unblocked position (dot-dashed lines). As can be seen from FIGS. 2 and 3, arm 11 is provided in the region of the free and with a rotatably arranged plate 42 which is driven with the aid of a toothed belt 43. Toothed belt 43 engages, in a manner which is not illustrated in more detail, on a toothed wheel which is arranged on splined shaft 44 and is driven with the aid of a motor 6, which is shown in FIG. 4. On coupling, pin 41 engages in a groove 45, thus producing a rotary drive using flange 20. The unlocking of locking arm 46 is controlled by means of actuating rod 47 which is shown in FIG. 3. Correct operation is monitored by a monitoring rod 48, which acts on a sensor which is not shown in further detail.

If door plate 2 is removed from arm 11, the fact that actuating rod 47 is not in operation means that after a certain degree of rotation shaft 10 and door plate 2 will always be coupled, so that the carrier is coupled in a rotationally fixed manner to this door plate. The actuating rod 47 is actuated pneumatically with the aid of cylinder 49. Three resilient support legs 50 are present on arm 11 for supporting the stationary part of the door plate. There is a seal 52 which provides for sealing with respect to the underside of the oven. Due to the fact that subatmospheric pressure is often used, a seal of this nature can be relatively simple to realize, setting aside the high temperatures occurring.

Figure 5:
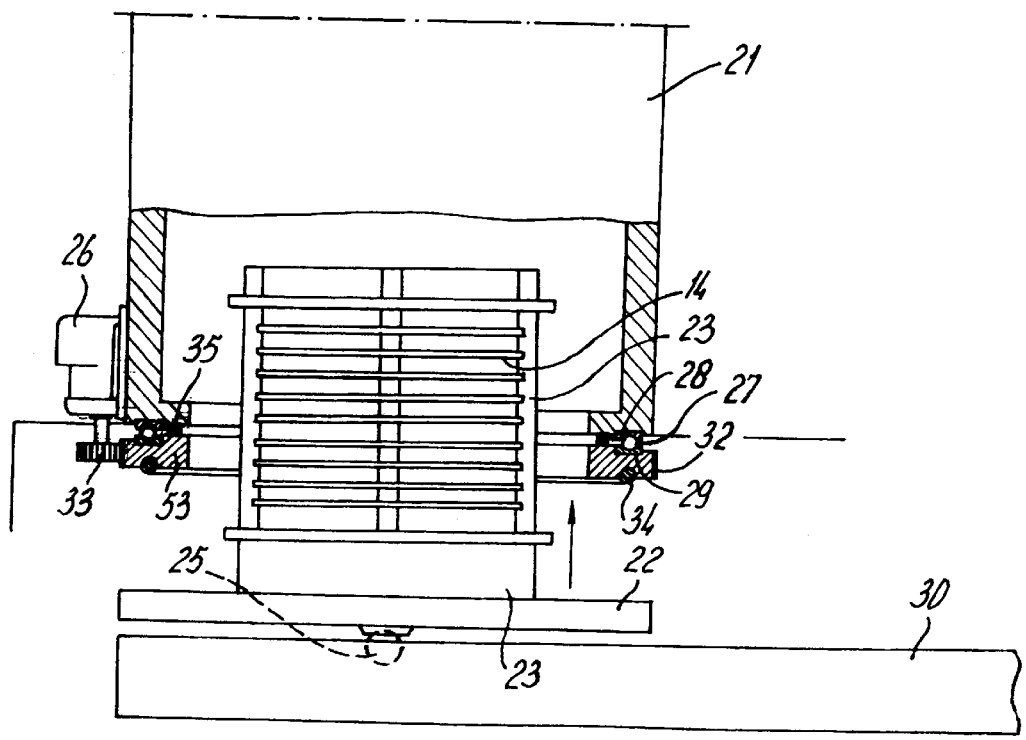
FIG. 5 diagrammatically shows a second embodiment of the device according to the invention.

FIG. 5 shows a variant of the structure according to the invention. In this figure, the oven is indicated by 21 and in this design carrier 23 and cover 22 are fixedly connected to one another. Connection to the arm 30 of the lifting device can be achieved via a relatively simple pivot ball 25 or the like. The edge of the opening 4 of the oven is provided with a bearing 27. This comprises an upper ring 28 and a lower ring 29. In this case, the support 53 of the lower ring is provided with toothing 32 which is acted on by a toothed wheel 33 of a motor 26. Support 53 is provided with a sealing ring 34 facing towards cover 22. Moreover, a seal 35 is present between support 53 and the oven 21. By moving arm 30 upwards, cover 22 is placed against inner ring 53 and the subatmospheric pressure produced automatically pulls the cover against this ring. Rotation can be achieved with the aid of motor 26.

It can be seen from the above that in both embodiments the motor 6 or 26 can beheld outside the clean room, so that dust produced by wear remains outside this room.

It can also be seen from the above that numerous variants of the inventive idea relating to the permanent coupling between carrier and door plate are possible. Obviously, variants of this kind lie within the scope of the present application.

What is claimed is:

1. A system for loading, processing and unloading substrates, comprising:

a carrier having a bottom and a plurality of slots to receive a plurality of substrates for processing in a reactor, wherein the reactor is tubular and has an inlet opening to receive said carrier loaded with said substrates;

a handling robot configured to load and unload said substrates to and from said carrier when said carrier is located outside said reactor;

a rotatable base plate configured to support said carrier and to move said carrier between a first position in proximity of said handling robot and a second position in proximity of said reactor;

a lifting device configured to introduce and remove said carrier in and from said reactor by lifting and lowering said carrier from and to the base plate when the carrier is in said second position;

a door plate configured to be coupled to said lifting device and to said bottom of said carrier, said door plate further configured to close the inlet opening of said reactor when said carrier is introduced in said reactor and to seal said reactor during processing;

a coupling mechanism configured to act upon said bottom of said carrier and through said door plate to thereby rotate said carrier when said carrier is introduced in said reactor so that said substrates are uniformly processed; and a drive motor stationarily arranged and configured to activate said coupling mechanism to rotate said carrier when said carrier is introduced in said reactor.

2. The system according to claim 1, wherein said door plate has a bearing comprising a first bearing part which is fixedly connected to the door plate and a second bearing part which is arranged such that it can rotate with respect to said door plate and to which the carrier is attached and provided with transmission means.

3. The system according to claim 2, wherein said transmission means comprise a shaft which extends through said door plate and is provided with said coupling mechanism for connection to a rotary drive.

4. The system according to claim 3, wherein said lifting device comprises the rotary drive.

5. The system according to claim 1, wherein said lifting device comprises a vertically displaceable lifting arm.

* * * * *